United States Patent
Honjo et al.

(10) Patent No.: US 10,833,256 B2
(45) Date of Patent: Nov. 10, 2020

(54) MAGNETIC TUNNEL JUNCTION ELEMENT AND METHOD FOR MANUFACTURING SAME

(71) Applicant: TOHOKU UNIVERSITY, Sendai (JP)

(72) Inventors: Hiroaki Honjo, Sendai (JP); Tetsuo Endoh, Sendai (JP); Shoji Ikeda, Sendai (JP); Hideo Sato, Sendai (JP); Hideo Ohno, Sendai (JP)

(73) Assignee: TOHOKU UNIVERSITY, Sendai (JP)

( * ) Notice: Subject to any disclaimer, the term of this patent is extended or adjusted under 35 U.S.C. 154(b) by 0 days.

(21) Appl. No.: 16/328,852

(22) PCT Filed: Mar. 21, 2017

(86) PCT No.: PCT/JP2017/011263
§ 371 (c)(1),
(2) Date: Feb. 27, 2019

(87) PCT Pub. No.: WO2018/042732
PCT Pub. Date: Mar. 8, 2018

(65) Prior Publication Data
US 2019/0189917 A1 Jun. 20, 2019

(30) Foreign Application Priority Data
Aug. 29, 2016 (JP) .................. 2016-166988

(51) Int. Cl.
*H01L 43/12* (2006.01)
*H01L 43/10* (2006.01)
(Continued)

(52) U.S. Cl.
CPC .............. *H01L 43/12* (2013.01); *H01L 43/02* (2013.01); *H01L 43/08* (2013.01); *H01L 43/10* (2013.01); *H01L 27/222* (2013.01)

(58) Field of Classification Search
None
See application file for complete search history.

(56) References Cited

U.S. PATENT DOCUMENTS

| 2003/0127747 A1 | 7/2003 | Kajiwara et al. |
| 2005/0260772 A1 | 11/2005 | Horng et al. |

(Continued)

FOREIGN PATENT DOCUMENTS

| JP | 11-97531 A | 4/1999 |
| JP | 11-251141 A | 9/1999 |

(Continued)

OTHER PUBLICATIONS

Sato et al., "Perpendicular-anisotropy CoFeB—MgO magnetic tunnel junctions with a MgO/CoFeB/Ta/CoFeB/MgO recording structure", Appl. Phys. Lett., 2012, 101, pp. 022414-1-022414-4, cited in Specification (5 pages).

(Continued)

*Primary Examiner* — Benjamin P Sandvik
(74) *Attorney, Agent, or Firm* — Westerman, Hattori, Daniels & Adrian, LLP

(57) ABSTRACT

A magnetic tunnel junction element includes, in a following stack order, an underlayer formed of a metal material, a fixed layer formed of a ferromagnetic body, a magnetic coupling layer formed of a nonmagnetic body, a reference layer formed of a ferromagnetic body, a barrier layer formed of a nonmagnetic body, and a recording layer formed of a ferromagnetic body, or alternatively, the magnetic tunnel junction element includes, in a following stack order, a recording layer formed of a ferromagnetic body, a barrier layer formed of a nonmagnetic body, a reference layer formed of a ferromagnetic body, a magnetic coupling layer formed of a nonmagnetic body, an underlayer formed of a metal material, and a fixed layer formed of a ferromagnetic body, wherein the fixed layer is formed and stacked after (Continued)

performing plasma treatment to a surface of the underlayer having been formed.

6 Claims, 16 Drawing Sheets

(51) Int. Cl.
*H01L 43/08* (2006.01)
*H01L 43/02* (2006.01)
*H01L 27/22* (2006.01)

(56) References Cited

U.S. PATENT DOCUMENTS

| | | | | |
|---|---|---|---|---|
| 2006/0292705 | A1* | 12/2006 | Hegde | G11B 5/3163 438/3 |
| 2007/0281079 | A1* | 12/2007 | Carey | G11B 5/3166 427/131 |
| 2010/0200394 | A1* | 8/2010 | Nagamine | |
| 2011/0293967 | A1 | 12/2011 | Zhang et al. | |
| 2012/0320666 | A1 | 12/2012 | Ohno et al. | |
| 2013/0134032 | A1* | 5/2013 | Tsunekawa | |
| 2014/0340961 | A1 | 11/2014 | Ohno et al. | |
| 2017/0025600 | A1 | 1/2017 | Ohno et al. | |
| 2017/0317273 | A1* | 11/2017 | Kitada | H01F 10/3254 |
| 2017/0317274 | A1 | 11/2017 | Seino | |

FOREIGN PATENT DOCUMENTS

| | | |
|---|---|---|
| JP | 11-330588 A | 11/1999 |
| JP | 2003-197673 A | 7/2003 |
| JP | 2005-333140 A | 12/2005 |
| JP | 2008-130962 A | 6/2008 |
| JP | 2011-249812 A | 12/2011 |
| JP | 2014-207469 A | 10/2014 |
| JP | 2015-88613 A | 5/2015 |
| WO | 2013/069091 A1 | 5/2013 |
| WO | 2016/125200 A1 | 8/2016 |

OTHER PUBLICATIONS

International Search Report (Form PCT/ISA/210) dated Jun. 6, 2017, issued in counterpart International Application No. PCT/JP2017/011263, w/English translation (4 pages).
WO/ISA (Written Opinion) (Form PCT/ISA237) dated Jun. 6, 2017, issued in counterpart International Application No. PCT/JP2017/011263 (4 pages).
WO/IPEA (Form PCT/IPEA/408) dated Jan. 23, 2018, issued in counterpart International Application No. PCT/JP2017/011263 (5 pages).
WO/IPEA (Form PCT/IPEA/408) dated May 15, 2018, issued in counterpart International Application No. PCT/JP2017/011263 (5 pages).
IPRP(Chapter II) (Form PCT/IPEA/409) dated Sep. 18, 2018, issued in counterpart International Application No. PCT/JP2017/011263 (4 pages).

* cited by examiner

MAGNETIC TUNNEL JUNCTION ELEMENT AND METHOD FOR MANUFACTURING SAME

TECHNICAL FIELD

The present invention relates to a magnetic tunnel junction element and a method for manufacturing the same.

BACKGROUND ART

In a magnetic switching using spin transfer torque (hereinafter referred to as "STT"), wilting current become small as the element size decreases, so that it is suitable for high density and low power memory element. Recently, magnetic random access memory (MRAM) utilizing such magnetic switching of STT (STT-MRAM) is attracting much attention.

STT-MRAM is composed of a magnetic tunnel junction (MTJ) element (hereinafter sometimes referred to as "MTJ element"). The MTJ element adopts a structure where a tunnel barrier layer (tunnel insulating film) is sandwiched between a reference (fixed) layer having a fixed magnetization direction and a recording (free) layer in which the magnetization direction varies.

Performance of the MTJ element is represented by tunnel magnetoresistance ratio (TMR ratio), thermal stability and threshold current. The TMR ratio is a value defined by $(R_{ap}-R_p)/R_p$ (wherein $R_p$ represents a resistance value in a state where magnetization of the reference layer and magnetization of the recording layer that are arranged adjacent to the barrier layer are arranged in parallel, and $R_{ap}$ represents a resistance value in a state where magnetization of the reference layer and the magnetization of the recording layer that are arranged adjacent to the barrier layer are arranged in antiparallel). Further, thermal stability is a value that is proportional to $K_{eff} \cdot V/k_B T$ (wherein $K_{eff}$ represents effective magnetic anisotropy energy density of the recording layer, V represents volume of the recording layer, $k_B$ represents Boltzmann's constant, and T represents absolute temperature). Generally, the TMR ratio of the MTJ element should preferably be greater, and the value having divided the thermal stability by threshold current should preferably be greater.

If the MTJ element has a magnetic anisotropy with perpendicular easy axis, the magnetic switching path is the same between STT switching and thermal switching. Meanwhile, if the MTJ element has a in-plane magnetic anisotropy, magnetic switching path caused by STT differs from that caused by thermal inversion. In this case, inversion by STT causes magnetization to flow through a plane-perpendicular direction having a large diamagnetic field, whereas in thermal inversion, magnetization flows through an in-plane direction having a small diamagnetic field. As a result, in in-plane magnetization, ratio of thermal stability to threshold current is small compared to perpendicular magnetization. Therefore, perpendicular magnetization-type MTJ element is attracting much attention recently, and such perpendicular magnetization-type MTJ element is being used.

As an example of such perpendicular magnetization-type MTJ element, an element having a high TMR ratio, high thermal stability and low threshold current is developed by using a ferromagnetic layer formed of CoFeB and an MgO insulation film (refer to Japanese Patent Literature 1), and the use of such materials as bases is investigated.

Further, in order to improve perpendicular magnetic anisotropy, a structure (double interface structure) such as an MgO (barrier layer)/CoFeB (recording layer)/MgO (protective layer) structure in which the recording layer (CoFeB) is sandwiched between the barrier layer (MgO) and the protective layer (MgO) containing oxygen has been developed (refer for example to Japanese Patent Literature 1). Further, materials adopting a double interface structure in which a conductive oxide layer is used as the protective layer or further having a metal cap layer arranged above the protective layer are developed (refer for example to Japanese Patent Literature 2).

The MTJ element having such double interface structure can realize a recording layer thickness that is greater than that of a tunnel junction element that does not have an MgO protective layer, due to two perpendicular magnetic anisotropies that are caused in the CoFeB/MgO interface under the recording layer and above the recording layer. Since thermal stability increases in proportion to the recording layer thickness, thermal stability can be improved by increasing the film thickness. Simultaneously, by increasing the recording layer thickness, damping constant a of the recording layer may also be reduced. Since the write current value is in proportion to the damping constant a, the write current value can be reduced at the same time. As a result, MTJ element having a double interface structure has high thermal stability and small write current, that is, the value obtained by dividing thermal stability by threshold current is high.

Meanwhile, in the MTJ element that has no MgO protective layer, a protective layer of Ta and the like is formed instead of the MgO protective layer on the recording layer. In this case, since Ta absorbs boron through heat processing, CoFeB is crystallized and a high TMR ratio is obtained.

However, since the MTJ element having a double interface structure described in Patent Literatures 1 and 2 sandwiches CoFeB with MgO, and it does not have a cap formed of Ta and the like, diffusion of boron by heat processing does not easily occur. Therefore, there was a drawback in that CoFeB is not crystallized by annealing and TMR ratio is deteriorated.

In order to prevent such deterioration of TMR ratio, an MTJ element having a thin nonmagnetic layer such as Ta inserted between the recording layer is proposed (refer for example to Non-Patent Literature 1). In this MTJ element, the nonmagnetic layer formed of Ta and the like absorbs boron through heat processing and CoFeB is crystallized, so that a high TMR ratio is obtained.

Further, an MTJ in which a reference layer of CoFeB interposing a thin Ta of approximately 4 Å so-called a magnetic coupling layer is formed on a film having a high perpendicular magnetic anisotropy such as a [Co/Pt] multi-layer film serving as the magnetization fixed layer is proposed (refer for example to Non-Patent Literature 1). In a CoFeB/MgO/CoFeB tunnel junction, a high TMR ratio is obtained when the CoFeB and the MgO are in (001) plane orientation. Since the [Co/Pt] has a (111) crystal alignment property of fcc, if the CoFeB reference layer is directly formed thereon, a high TMR ratio cannot be obtained since CoFeB is crystally aligned to the fcc crystal orientation of [Co/Pt]. The magnetic coupling layer is used to disconnect the [Co/Pt] crystal alignment at this layer, so as to align the CoFeB in the (001) direction and to achieve a high TMR ratio.

CITATION LIST

Patent Literature

[PTL 1] Japanese Patent Application Laid-Open Publication No. 2014-207469
[PTL 2] PCT International Application Publication No. 2013/069091

Non Patent Literature

[NPL 1] H. Sato, M. Yamanouchi, S. Ikeda, S. Fukami, F. Matsukura, and H. Ohno, "Perpendicular-anisotropy CoFeB—MgO magnetic tunnel junctions with a MgO/CoFeB/Ta/CoFeB/MgO recording structure", Appl. Phys. Lett., 2012, 101, 022414

SUMMARY OF INVENTION

Technical Problem

The actual structure of a magnetic tunnel junction element has a lower electrode layer 28 and an underlayer 29 formed on a substrate 27, and on the underlayer 29 are formed, in the following stack order, a fixed layer 25, a magnetic coupling layer 26, a reference layer 11, a barrier layer 12, a recording layer 13, a protective layer 14 and an upper electrode layer 30, as illustrated in FIG. 1 as an example.

A Co alloy-based perpendicular magnetic film, such as Co/Pt, is often used as the fixed layer, as described later. In order for the Co alloy film to have perpendicular magnetic anisotropy, it is necessary for the film to be a polycrystalline alignment film in which the (0001) direction being an easy axis of magnetization of the hcp structure is perpendicular to the substrate.

As a method for aligning the Co alloy film in this manner, a method for realizing heteroepitaxial growth on the underlayer is adopted. If Co alloy is deposited on an underlayer of a (0001) alignment film having an hcp structure or a (111) alignment film having an fcc structure adopting a similar arrangement as the atomic arrangement of a densest surface of the hcp structure, the Co alloy film is influenced by the crystal alignment of the underlayer and a polycrystalline alignment film having a (0001) surface arranged in parallel with the foundation is grown. As an example of such material, for example, Ti, Sc, Ru and Hf film having an hcp structure, or a Pt, Pd, Au and Cu film having an fcc structure are often used.

Among these materials, if platinum (hereinafter referred to as "Pt") is used as the underlayer 29, after depositing the Pt underlayer, a [Co/Pt] multilayer film (in which a Co film and a Pt film are stacked alternately) forming a portion of the fixed layer 25 is deposited, and after this layer is deposited, the respective layers are formed in the above-described order, and finally, the structure is subjected to heat processing. It has been determined through measurement analysis (through EDX-ray (energy dispersive X-ray) as illustrated in FIG. 11(a), as described layer in the preferred embodiment of the present invention) that a phenomenon occurs in this state in which the Fe of the CoFeB constituting the reference layer 11 is diffused to the Co/Pt multilayer film side of the lower layer by heat processing (annealing). This phenomenon presents a problem that causes the perpendicular magnetic anisotropy to be deteriorated and the TMR ratio to drop.

The present invention focuses on this problem, and the object of the invention is to solve this problem and provide a method for manufacturing a magnetic tunnel junction element that improves heat resistance and TMR ratio and a magnetic tunnel junction element generated by this method.

Solution to Problem

In order to achieve the above-described object, a method for manufacturing a magnetic tunnel junction element according to the present invention performs sputter etching, so-called "plasma treatment" (hereinafter abbreviated as "PT") of the metal surface. That is, the present invention characterizes in forming a magnetic tunnel junction element configured by stacking, in a following stack order, an underlayer formed of a metal material, a fixed layer formed of a ferromagnetic body and in which a magnetization direction is fixed, a magnetic coupling layer formed of a nonmagnetic body, a reference layer formed of a ferromagnetic body and in which the magnetization direction is fixed, a barrier layer formed of a nonmagnetic body, and a recording layer formed of a ferromagnetic body, or alternatively, the magnetic tunnel junction element configured by stacking, in a following stack order, a recording layer formed of a ferromagnetic body, a barrier layer formed of a nonmagnetic body, a reference layer formed of a ferromagnetic body and in which a magnetization direction is fixed, a magnetic coupling layer formed of a nonmagnetic body, an underlayer formed of a metal material, and a fixed layer formed of a ferromagnetic body and in which the magnetization direction is fixed, wherein the fixed layer is formed and stacked after performing plasma treatment to a surface of the underlayer having been formed.

Advantageous Effects of Invention

According to the present invention, after forming the Pt foundation serving as an underlayer of the magnetic tunnel junction element, the Pt surface is subjected to plasma treatment using Ar and the like, and thereafter a fixed layer formed of the [Co/Pt] multilayer film is formed thereto, by which smoothness and crystal alignment property of the fixed layer formed of the [Co/Pt] multilayer film are improved, and thereby, heat resistance and TMR ratio of the magnetic tunnel junction element are improved.

DESCRIPTION OF EMBODIMENTS

Now, preferred embodiments of the present embodiment will be described with reference to the drawings.

Figure 1:
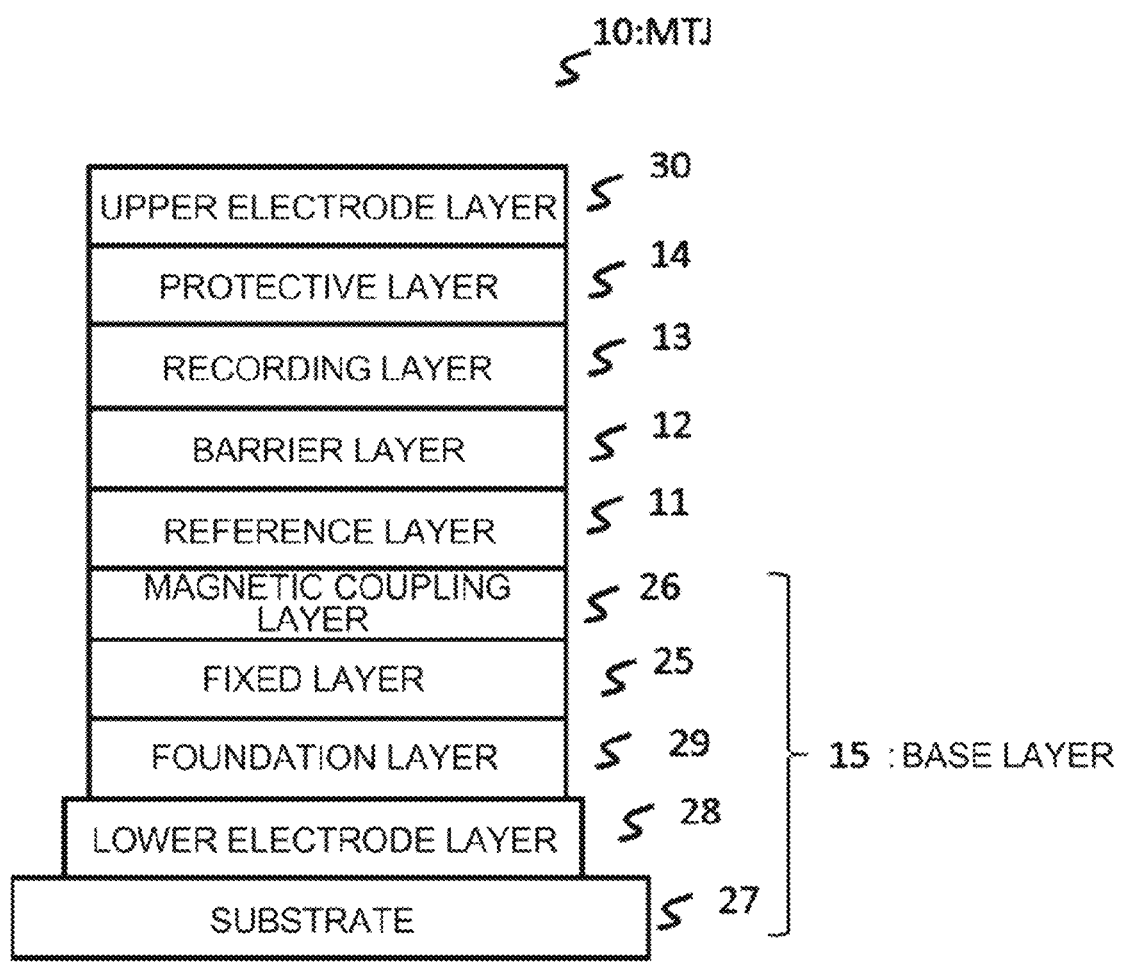
FIG. 1 illustrates a view illustrating a typical configuration example (first configuration example) of a stack structure of a magnetic tunnel junction element (MTJ element) according to the present invention.

FIG. 1 is a view illustrating a typical configuration example (first configuration example) of a stack structure of a magnetic tunnel junction (MTJ) element according to the present invention.

A magnetic tunnel junction element 10 includes a structure having stacked a reference layer 11, a barrier layer 12, a recording layer 13 and a protective layer 14 in the named order, and a base layer 15 on which the respective layers are formed by sputtering and the like. Specifically, as illustrated, the magnetic tunnel junction element 10 adopts a structure in which a lower electrode layer 28 and an underlayer 29 are formed on a substrate 27, and on the underlayer 29 are formed, in the following stack order, a fixed layer 25, a magnetic coupling layer 26, the reference layer 11, the barrier layer 12, the recording layer 13, the protective layer 14 and an upper electrode layer 30. This structure can be fabricated by forming the respective layers on the substrate 27, and thereafter subjecting the same to heat processing. In FIG. 1, the substrate 27, the lower electrode layer 28, the underlayer 29, the fixed layer 25 and the magnetic coupling layer 26 constitute the base layer 15.

Now, the respective layers will be described in order, and as for the base layer 15, the fixed layer 25 and the magnetic coupling layer 26 which are arranged close to the reference layer 11 will be described first.

The fixed layer 25 constituting the base layer 15 is a ferromagnetic body whose magnetization direction is fixed in a perpendicular direction with respect to a film surface.

The magnetic coupling layer 26 constituting the base layer 15 is a nonmagnetic body formed of a Ta film with a thickness of 0.4 nm, for example. Material other than Ta, such as at least one of Hf, W, Mo, Nb, Zr, Y, Sc, Ti, V and Cr, can be used as film material.

The reference layer 11 is a ferromagnetic body whose magnetization direction is fixed in a perpendicular direction with respect to the film surface, and it is formed of a CoFeB film with a thickness of 1.0 to 1.2 nm, for example.

The barrier layer 12 is a nonmagnetic body containing oxygen, and it is formed of an MgO film with a thickness of 1.0 to 1.3 nm, for example. However, it is not indispensable to have oxygen contained in the nonmagnetic body.

The recording layer 13 is a ferromagnetic body whose magnetization direction is variable in the perpendicular direction with respect to the film surface, and for example, although not illustrated, it can adopt a structure where a first ferromagnetic layer, an insertion layer formed of nonmagnetic body and a second ferromagnetic layer are stacked in the named order, wherein the first ferromagnetic layer and the second ferromagnetic layer are magnetically coupled via the insertion layer. In this state, the magnetization direction of the first ferromagnetic layer is variable in the perpendicular direction with respect to the film surface, and the first ferromagnetic layer is formed of a CoFeB film having a thickness of 1.4 to 1.5 nm, for example. The insertion layer is a nonmagnetic body formed of a Ta or W film with a thickness of 0.2 to 0.5 nm, for example. The second ferromagnetic layer has a magnetization direction that is variable in the perpendicular direction with respect to the film surface, and it is formed of a CoFeB film having a thickness of 1.0 to 1.5 nm, for example.

The protective layer 14 is a nonmagnetic body containing oxygen, and it is formed of an MgO film with a thickness of 1.0 to 1.1 nm, for example. However, it is not indispensable to have oxygen contained in the nonmagnetic body. Further, the protective layer 14 may be formed of a conductive oxide film.

As described above, the fixed layer 25 and the magnetic coupling layer 26 are included as the base layer 15, and the base layer 15 is arranged on a side opposite from the side of the reference layer 11 having the barrier layer 12.

Figure 2:
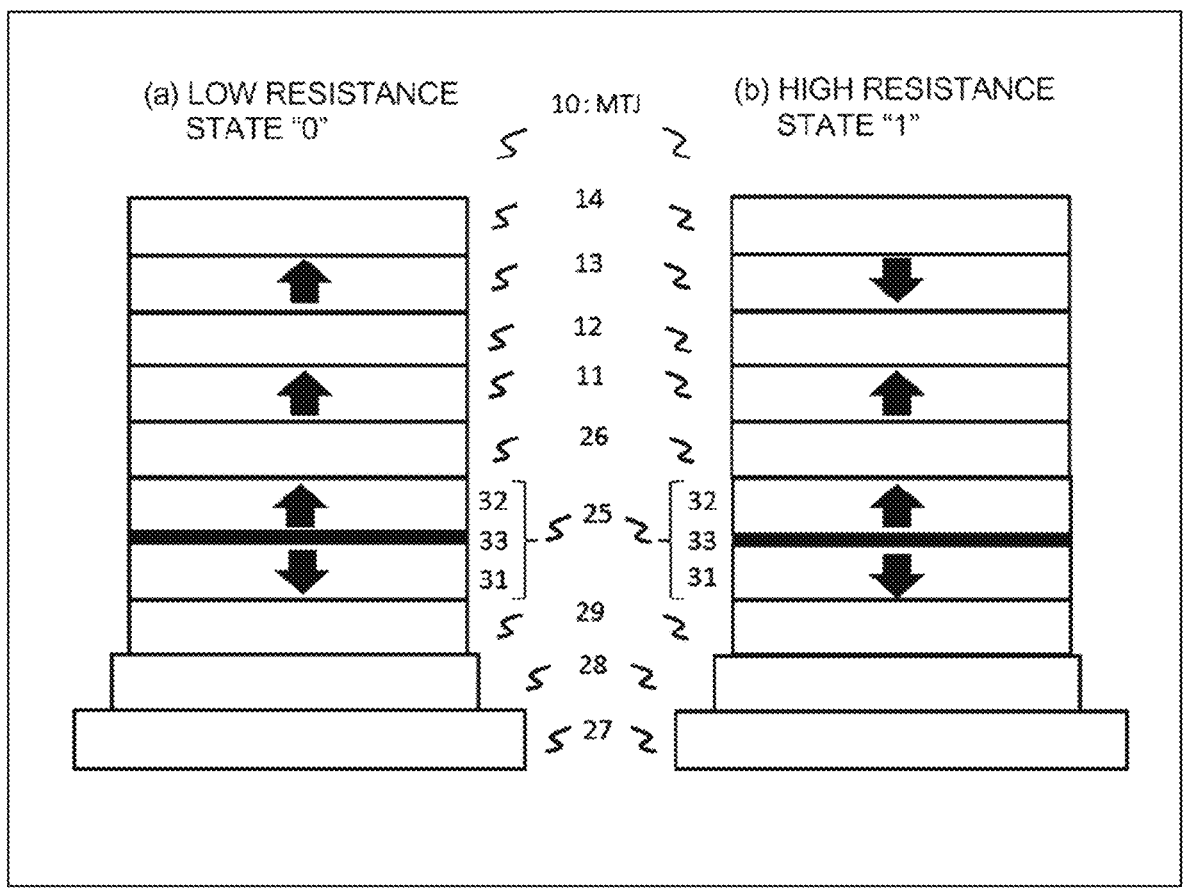
FIG. 2 is an explanatory view illustrating the stack structure of the magnetic tunnel junction element according to the present invention, wherein (a) illustrates a low resistance state and (b) illustrates a high resistance state.

The fixed layer 25 includes, as illustrated in FIG. 2, a third ferromagnetic layer 31, a fourth ferromagnetic layer 32 and a nonmagnetic layer 33 sandwiched therebetween.

The third ferromagnetic layer 31 is formed by respectively alternately stacking Co films having a thickness of 0.5 nm and Pt films having a thickness of 0.3 nm for four times, and then stacking a Co film having a thickness of 0.5 nm thereon.

The fourth ferromagnetic layer 32 is formed by respectively alternately stacking Co films having a thickness of 0.5 nm and Pt films having a thickness of 0.3 nm for two times, and then stacking a Co film having a thickness of 0.5 nm thereon.

The nonmagnetic layer 33 is formed of an Ru film having a thickness of 0.9 nm, for example.

In the fixed layer 25, via the nonmagnetic layer 33, magnetization directions of the third ferromagnetic layer 31 and the fourth ferromagnetic layer 32 are mutually opposite in the perpendicular direction with respect to the film surface by RKKY interaction.

The magnetic coupling layer 26 is a nonmagnetic body sandwiched between the fixed layer 25 and the reference layer 11 and formed of a Ta film having a thickness of 0.4 nm, for example.

Further, the fixed layer 25 is arranged so that the fourth ferromagnetic layer 32 is in contact with the magnetic coupling layer 26.

The reference layer 11 is magnetically coupled to the fixed layer 25 via the magnetic coupling layer 26 and the magnetization direction thereof is fixed in one direction in the perpendicular direction with respect to the film surface.

The magnetic tunnel junction element 10 has magnetic tunnel junction deposited between the reference layer 11 and the recording layer 13 via the barrier layer 12. Further, as illustrated in FIG. 1, the magnetic tunnel junction element 10 adopts a double interface structure in which the recording layer 13 is sandwiched between the barrier layer 12 and the protective layer 14, wherein perpendicular magnetic anisotropy occurs respectively at the interface between the recording layer 13 and the barrier layer 12 and at the interface between the recording layer 13 and the protective layer 14, and wherein the magnetization direction of the recording layer 13 is perpendicular with respect to the film surface. Further, the magnetic tunnel junction element 10 is formed so that the magnetization direction of the recording layer 13 varies by spin injection magnetization inversion.

In manufacturing the magnetic tunnel junction element 10, the reference layer 11, the barrier layer 12, the recording layer 13 and the protective layer 14 are formed in the named order on the base layer 15, and heat processing is performed thereto. As a method for depositing each layer, sputtering which is a physical vapor deposition method or molecular beam epitaxial growth method (MBE method) can be used. The temperature of heat processing should preferably be 350 to 450° C.

Next, components of the base layer 15 other than the fixed layer 25 and the magnetic coupling layer 26 described above will be described.

The substrate 27 adopts a structure containing a transistor and a multilayer of wiring layers.

The lower electrode layer 28 is a conductive layer having a thickness of approximately 20 to 50 nm, formed of metal material such as Ta, TaN, Ti, TiN, Cu, CuN, Au, Ag and Ru or an alloy thereof, for example. Further, the lower electrode layer 28 may adopt a structure in which multiple metal materials are stacked, such as a Ta/Ru/Ta structure. The lower electrode layer 28 is a layer that forms a foundation on which layers are formed, and after deposition, the surface thereof is flattened by chemical-mechanical polishing (CMP) or gas cluster ion beam (GCIB) and the like.

The underlayer 29 is formed of a Pt film having a thickness of approximately 5 nm, for example, but it can also be formed of metal material other than Pt, such as Ti, Sc, Pd, Ru, Cu, Au and Hf.

The upper electrode layer 30 is a conductive layer having a thickness of 10 to 100 nm, for example, and it is formed of a metal material such as Ta, TaN, Ti, TiN, Cu, CuN, Au, Ag and Ru or an alloy thereof. Further, the upper electrode layer 30 can adopt a structure where multiple metal materials are stacked, such as a Ta/Ru structure.

Next, we will describe reading/writing of information to the magnetic tunnel junction element 10.

In the magnetic tunnel junction element 10, as illustrated in FIG. 2(a), in a state where the magnetization direction of the reference layer 11 and the magnetization direction of the recording layer 13 are mutually in parallel and in the same direction (P state), the state between the lower electrode layer 28 and the upper electrode layer 30 will be of low resistance. Meanwhile, as illustrated in FIG. 2(b), in a state where the magnetization direction of the reference layer 11 and the magnetization direction of the recording layer 13 are antiparallel (parallel and in opposite directions: AP state), the state between the lower electrode layer 28 and the upper electrode layer 30 will be of high resistance. Information can be written by setting the high state and the low state of resistance to correspond to "0" and "1" of bit information.

In the example illustrated in FIG. 2, "0" is assigned to the low resistance state and "1" is assigned to the high resistance state.

When writing information to the magnetic tunnel junction element 10, "0" or "1" can be written by changing the direction of write current flown between the lower electrode layer 28 and the upper electrode layer 30. If write current is supplied from the upper electrode layer 30 toward the lower electrode layer 28, as illustrated in FIG. 2(a), magnetization direction of the recording layer 13 becomes equal to the magnetization direction of the reference layer 11, so that "0" is written. Meanwhile, if written current is flown from the lower electrode layer 28 toward the upper electrode layer 30, as illustrated in FIG. 2(b), the magnetization direction of the recording layer 13 becomes opposite to the magnetization direction of the reference layer 11, so that "1" is written.

Meanwhile, when reading information from the magnetic tunnel junction element 10, readout voltage is applied between the lower electrode layer 28 and the upper electrode layer 30, by which current corresponding to the respective resistances of "0" or "1" is flown. By detecting this current, information ("0" or "1") written in the magnetic tunnel junction element 10 can be read.

Figure 3:
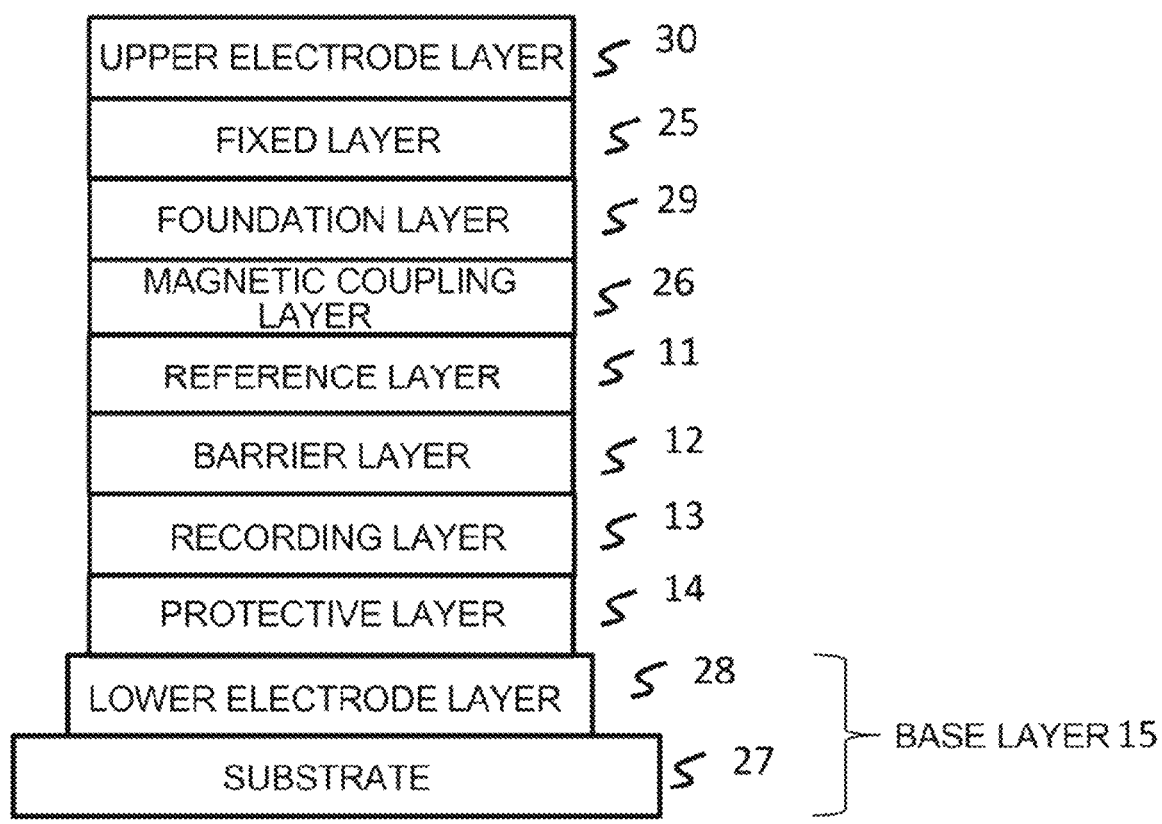
FIG. 3 is a view illustrating a second configuration example of a stack structure of the magnetic tunnel junction element according to the present invention.

Further, FIG. 3 illustrates a second configuration example of a stack structure of the magnetic tunnel junction element 10. The second configuration example is a configuration where the layers from the fixed layer 25 to the protective layer 14 illustrated in FIG. 1 are reversed and formed as a stack structure as illustrated in FIG. 3, and where the underlayer 29 is inserted between the magnetic coupling layer 26 and the fixed layer 25. In this case, the protective layer 14 and the lower electrode layer 28 are in contact, and the fixed layer 25 and the upper electrode layer 30 are in contact. The substrate 27 and the lower electrode layer 28 constitute the base layer 15. In order to enhance the magnetic coupling between the reference layer 11 and the fixed layer 25, a thin magnetic film may be inserted between the magnetic coupling layer 26 and the underlayer 29.

Figure 4:
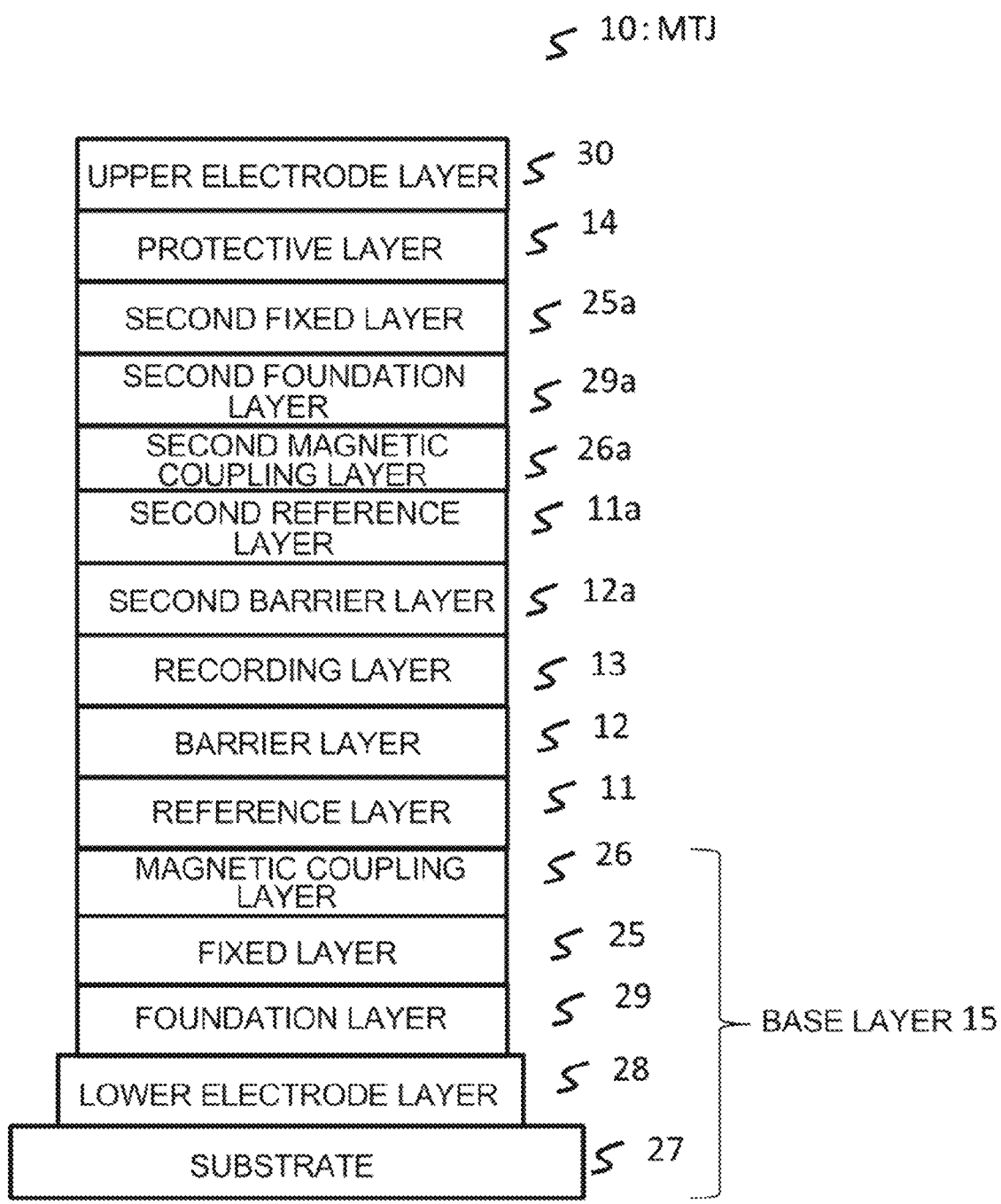
FIG. 4 is a view illustrating a third configuration example of a stack structure of the magnetic tunnel junction element according to the present invention.

FIG. 4 illustrates a third configuration example of a stack structure of the magnetic tunnel junction element 10. The third configuration example adopts a structure, as illustrated in FIG. 4, in which a second barrier layer 12a, a second reference layer 11a, a second magnetic coupling layer 26a, a second underlayer 29a and a second fixed layer 25a are inserted and stacked between the recording layer 13 and the protective layer 14, in the named order from the side of the recording layer 13. In this example, the five layers from the substrate 27 to the magnetic coupling layer 26 constitute the base layer 15. A thin magnetic film may be inserted between the second magnetic coupling layer 26a and the second underlayer 29a enhance magnetic coupling.

Next, regarding the method for manufacturing the magnetic tunnel junction element 10, a method for forming an underlayer and thereafter subjecting the surface of the underlayer to sputter etching so-called plasma treatment (hereinafter also referred to as "PT") will be described below as an example of the method for manufacturing the element according to the present invention.

EXAMPLE

At first, a variation of surface roughness of a stack surface of the magnetic tunnel junction element by plasma treatment (PT) will be described.

Regarding the magnetic tunnel junction element according to the present example, a Co alloy-based perpendicular magnetic film such as the Co/Pt stacked film described above, a Co/Pd stacked film, a Co/Ni stacked film, a CoPt alloy film, a CoCrPt alloy film or a CoCrRu alloy film is used. In order for the Co alloy film to have perpendicular magnetic anisotropy, as described above, it is necessary that the film is a polycrystalline alignment film whose (0001) direction which is an easy axis of magnetization of the hcp structure is perpendicular to the substrate, so that a method of realizing heteroepitaxial growth of the Co alloy film on the underlayer is adopted. That is, if a (0001) alignment film having an hcp structure or an (111) alignment film having an fcc structure with a similar atomic arrangement as the atomic arrangement of a densest surface of the hcp structure is used as the underlayer and a Co alloy is formed thereon, the Co alloy film is influenced by the crystal alignment of the underlayer and a polycrystalline alignment film having a (0001) surface that is parallel with the foundation is grown. In order to satisfy this condition, the above-described metal material (such as Pt, Ti, Sc, Pd, Ru, Cu, Au and Hf) is used as the material for the underlayer. As for structure, Ti, Sc, Ru and Hf adopt the hcp structure and Pt, Pd, Cu and Au adopts the fcc structure.

Figure 5:
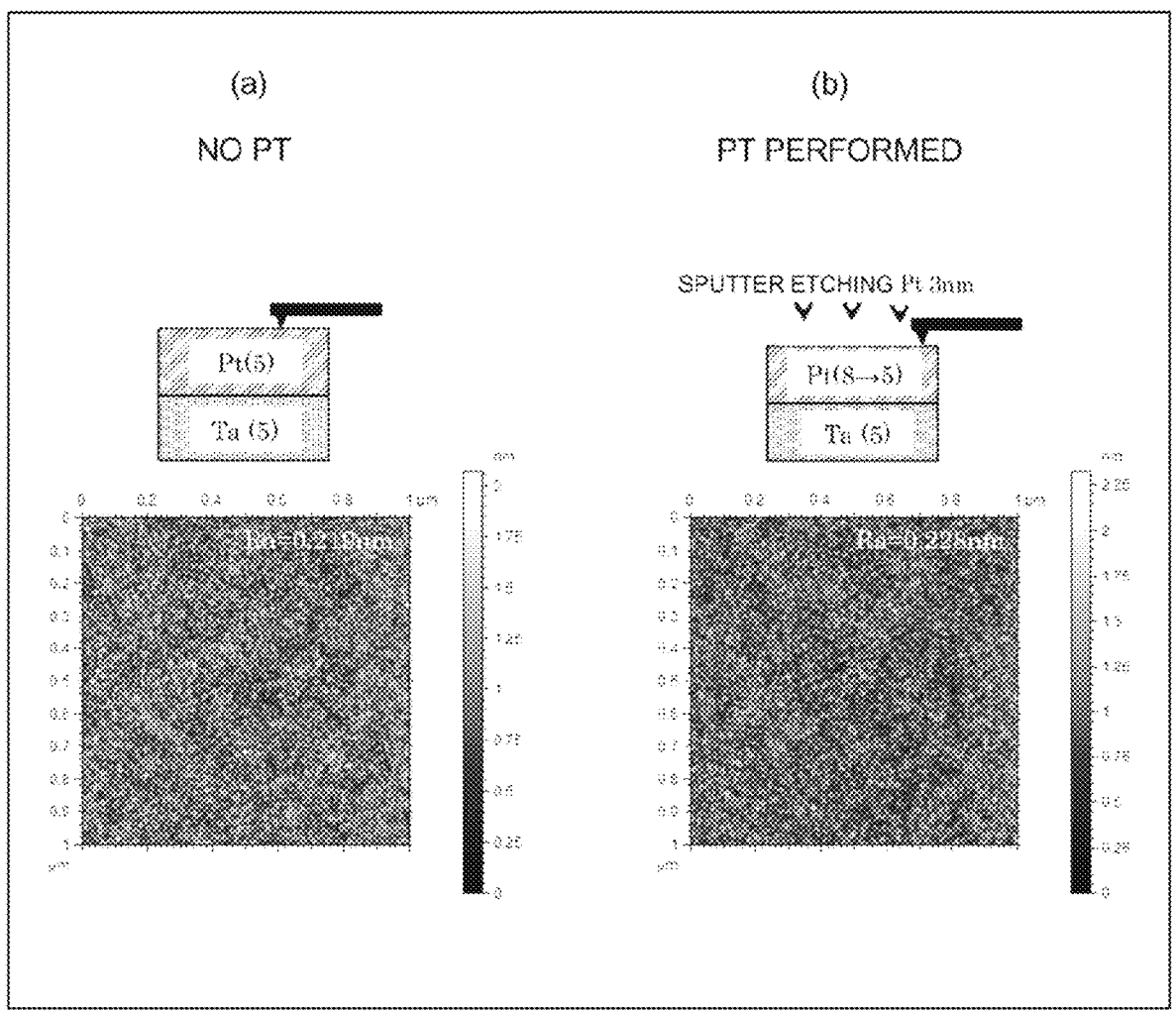
FIG. 5 is a view illustrating a measurement result of mean surface roughness (Ra) of a Pt surface.

In performing PT to the Pt foundation of the underlayer, at first, the result of measurement of mean surface roughness (Ra) of the Pt surface with PT performed/not performed is illustrated. FIG. 5(a) illustrates a measurement result of a case where PT is not performed on the Pt foundation, and FIG. 5(b) illustrates a measurement result of a case where PT is performed (by performing PT, thickness of Pt of 8 nm was reduced to 5 nm, which is equivalent to the state where PT was not performed). It has been recognized according to the measurement results of the mean surface roughness (Ra) of the Pt surface that Ra=0.219 nm in the case where PT was not performed and Ra=0.228 in the case where PT was performed, which were recognized to be not so different.

Figure 6:
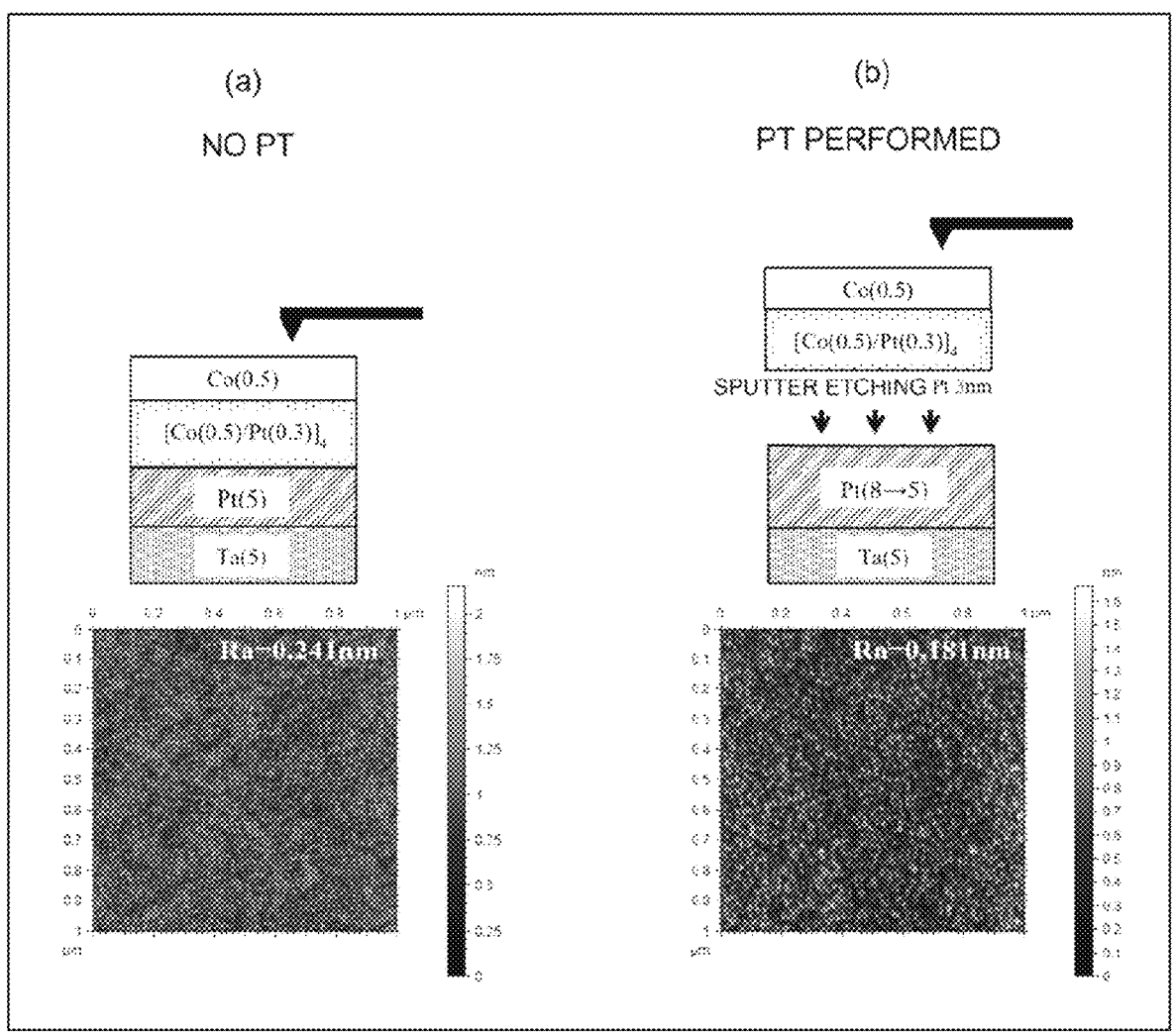
FIG. 6 is a view illustrating a measurement result of mean surface roughness (Ra) of Co/Pt surface of cases where PT is performed/not performed.

Therefore, the variation of surface roughness was measured of a case where a fixed layer is further stacked on the Pt foundation of the underlayer. A Co film having a thickness of 0.5 nm and a Pt film having a thickness of 0.3 nm were respectively alternately formed four times as the fixed layer (hereafter, this stack is referred to as "Co/Pt", and in the drawing, the four stacked layers is referred to as "[Co (0.5)/Pt (0.3)]$_4$), and a Co film having a thickness of 0.5 nm (corresponding to the third ferromagnetic layer 31 described above) was formed. FIG. 6 illustrates a measurement result of mean surface roughness (Ra) of cases where PT was performed and where PT was not performed to the Pt foundation. FIG. 6(a) illustrates a measurement result of a case where PT was not performed, and FIG. 6(b) illustrates a measurement result of a case where PT was performed (similar to the case of FIG. 5, by performing PT, Pt having a thickness of 8 nm was reduced to a thickness of 5 nm, which is equivalent to the state where PT was not performed). Ra=0.241 nm in the case where PT was not performed and Ra=0.181 in the case where PT was performed, and it could be recognized that Co/Pt became smooth by performing PT to the PT foundation even in a state where the fixed layer was stacked.

Next, the effect of plasma treatment (PT) on the heat resistance will be described.

Figure 7:
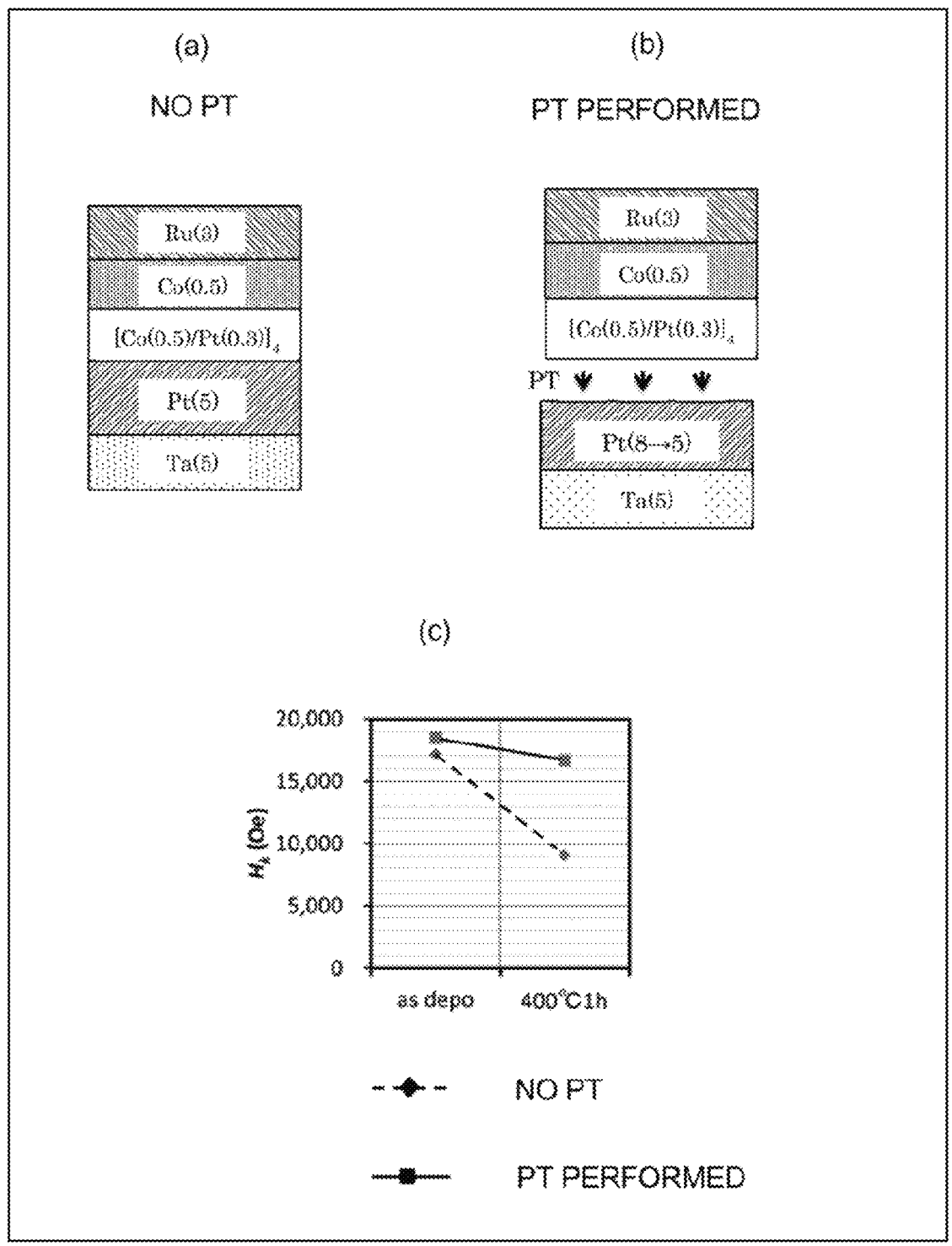
FIG. 7 is a view illustrating a measured value of anisotropy field Hk immediately after deposition and during heat processing of cases where PT is performed/not performed.

Variation of perpendicular magnetic anisotropy of the [Co/Pt] multilayer film after performing heat processing by performing PT to the Pt foundation was measured. FIG. 7 illustrates comparison results of measured values of anisotropy field Hk of cases where PT was performed immediately after deposition (as depo) and after performing annealing at 400° C. for one hour respectively for cases where PT was performed and where PT was not performed to the Pt foundation in a state where a layer having a 3 nm thickness (corresponding to the nonmagnetic layer 33) was stacked on the stack structure illustrated in FIG. 6. FIG. 7(a) illustrates a stack structure where PT was not performed, FIG. 7(b) illustrates a stack structure where PT was performed, and FIG. 7(c) illustrates a graph of measured values of anisotropy field Hk of respective cases where PT was performed and PT was not performed. In FIGS. 7(a) and 7(b), the stack structures are the same after PT processing was performed, but similar to FIGS. 5 and 6, in the structure of (b) where PT was performed, the Pt film thickness was reduced from 8 nm to 5 nm by PT processing. By performing heat processing at 400° C., in the case where PT was not performed, the anisotropy field Hk was decreased to almost half, whereas in the case where PT was performed, the reduction rate of the anisotropy field Hk was suppressed to less than 10 percent. That is, by performing PT to the Pt foundation, it was recognized that even after performing heat processing at 400° C., the deterioration of perpendicular magnetic anisotropy of the [Co/Pt] multilayer film could be suppressed.

Figure 8:
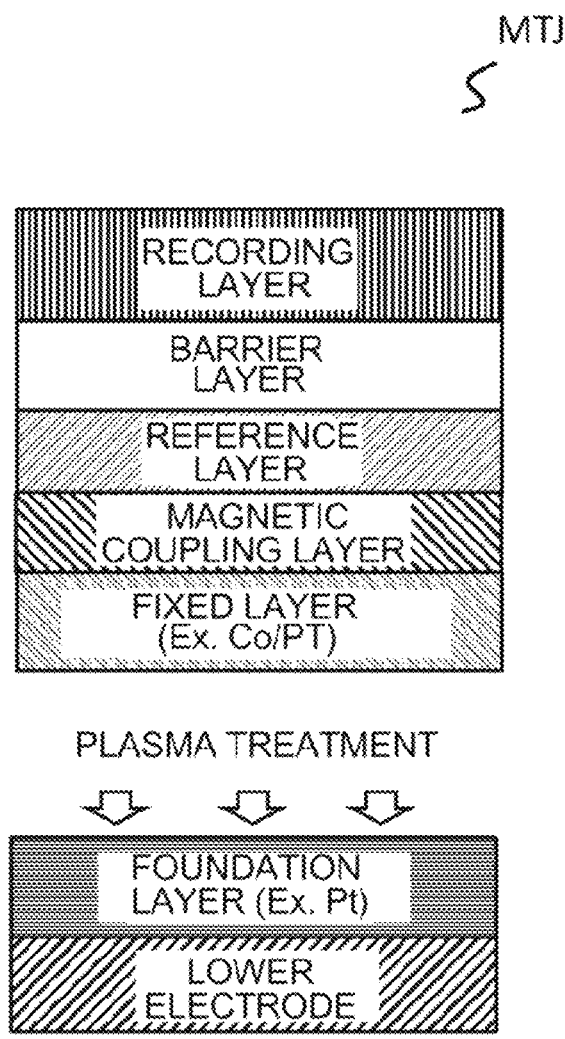
FIG. 8 is a simplified view of a method for manufacturing a magnetic tunnel junction element according to the present embodiment.

FIG. 8 is a simplified view of the method for manufacturing a magnetic tunnel junction element according to the embodiment of the present invention. In the process for stacking and manufacturing the magnetic tunnel junction element, after depositing a material (such as Pt) constituting the underlayer, plasma treatment (PT) is performed to the Pt surface using rare gas such as Ar, Kr and Xe, and thereafter, a fixed layer formed of [Co/Pt], for example, is formed.

Now, we will describe what effects were seen on magnetic characteristics by performing plasma treatment (PT).

Figure 9:
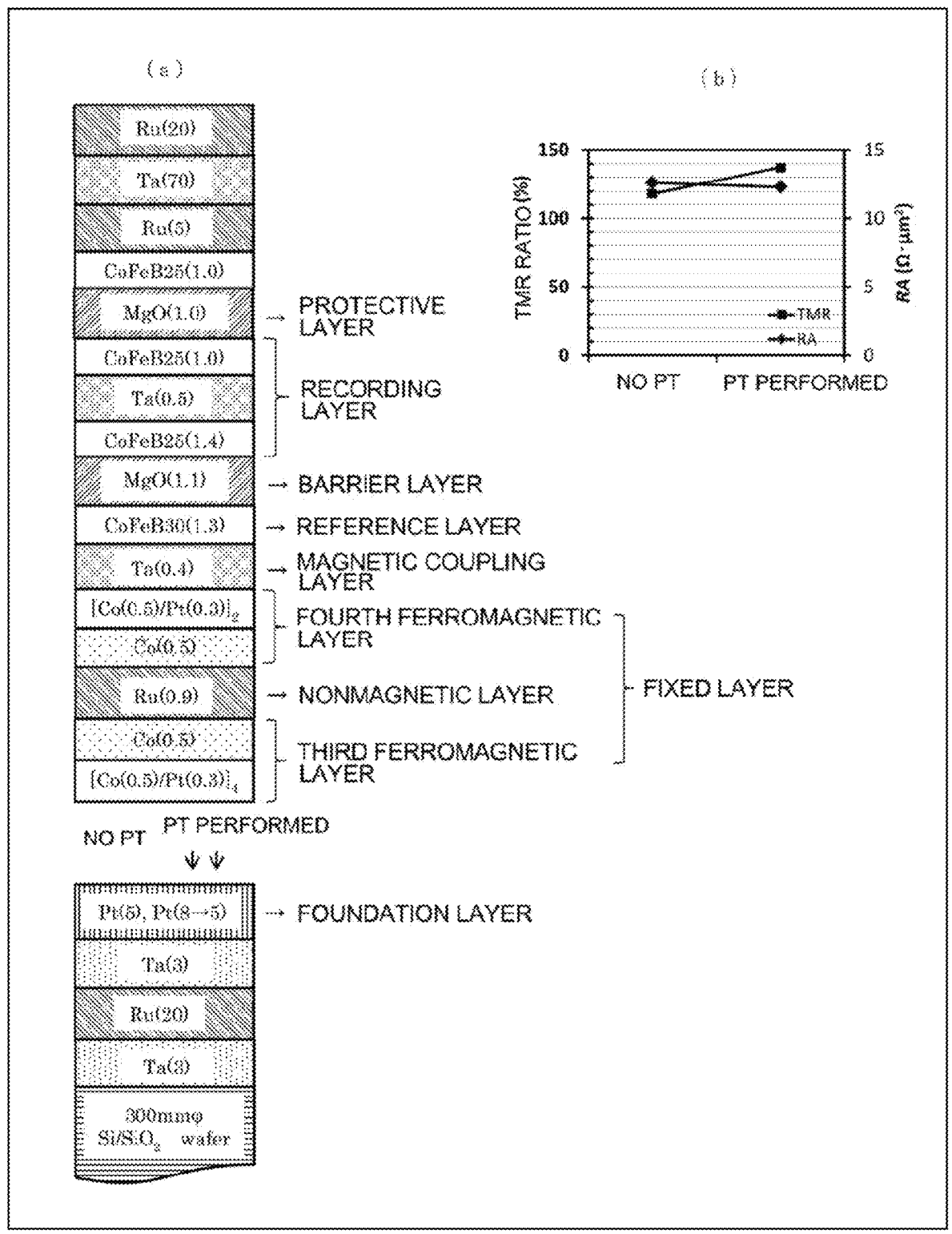
FIG. 9 is a view illustrating a variation of measured value of TMR ratio and resistance-area product (RA) of cases where PT is performed/not performed.

FIG. 9 is a view (graph) illustrating a variation of measured value of TMR ratio and resistance-area products (RA) of cases where PT was performed/not performed to the Pt foundation in the stack structure of the magnetic tunnel junction element described earlier. FIG. 9(a) illustrates a stack structure of the magnetic tunnel junction element used for actual measurement, and FIG. 9(b) illustrates a graph of measured values of the TMR ratio and the resistance-area products (RA) for respective cases where PT is performed/not performed. In FIG. 9(a), for simplification, "Pt (5)" on the underlayer illustrates the case where PT is not performed, and "Pt (8→5)" illustrates the case where PT is performed (similar to FIGS. 5 through 7). RA (Resistance-Area product) represents junction resistance, and the value represents a standardized resistance value per unit area (1 µm$^2$) of TMR element, which can be referred to as a performance index of MTJ.

Regarding TMR ratio, if PT is performed, the TMR ratio is increased by approximately 20% compared to the case where PT is not performed, and regarding resistance-area products (RA), it is recognized that there is only little variation. That is, by performing PT to the Pt foundation, the TMR ratio, and as a result, the magnetic characteristics, can be improved.

Further, the relationship between etching depth by plasma treatment (PT) and TMR ratio characteristics will be described.

Figure 10:
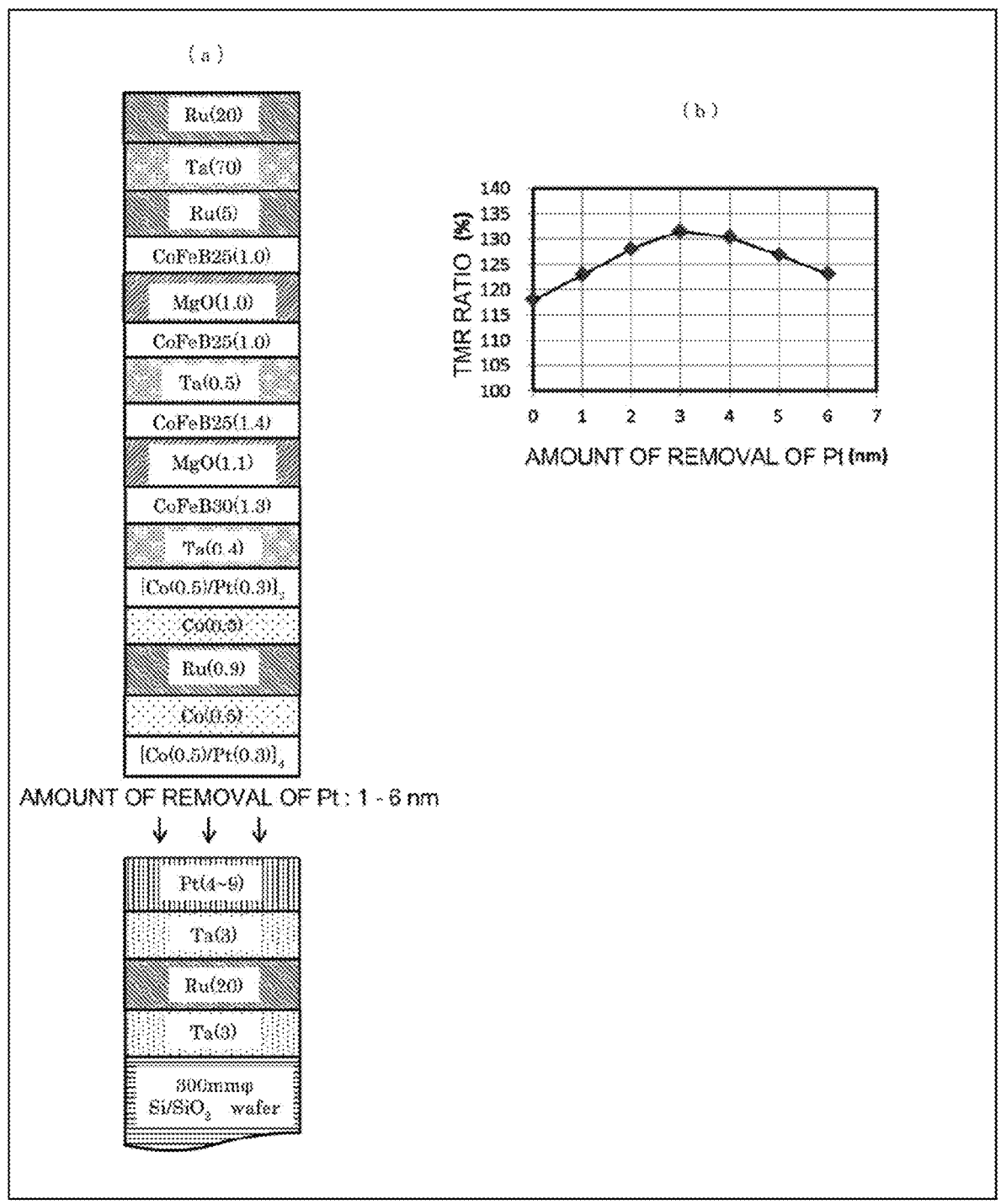
FIG. 10 is a view illustrating a relationship between etching depth by PT and TMR ratio.

FIG. 10 is a view (graph) illustrating a relationship between etching depth by PT of the PT foundation and the TMR ratio in the stack structure of the magnetic tunnel junction element described earlier. FIG. 10(a) illustrates a stack structure of the magnetic tunnel junction element used for actual measurement, and FIG. 10(b) illustrates a graph of the characteristics of TMR ratio of cases where PT is not performed to various amounts of removal from a state where PT is not performed to a state where PT is performed to Pt to a range up to 6 nm. It can be recognized that the TMR ratio tends to decrease at both greater and smaller amounts of removal with the peak at approximately 3 nm of etching depth. That is, the TMR ratio characteristics is not simply improved by increasing the etching depth, and that there is an appropriate etching depth.

Next, we will describe the phenomenon (change) that has occurred in the stack structure of the magnetic tunnel junction element by plasma treatment (PT) performed to the Pt foundation.

Figure 11:
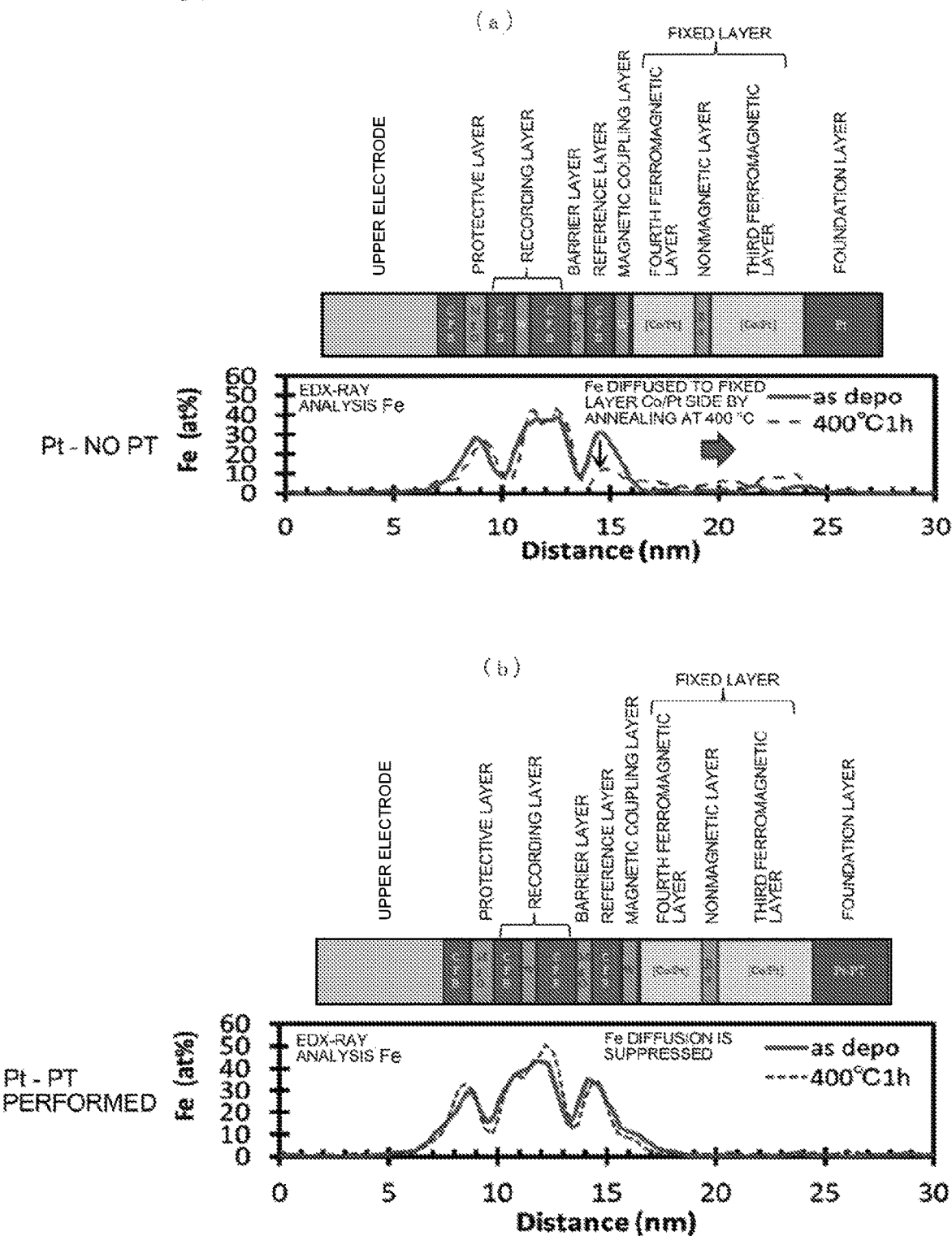
FIG. 11 is a view illustrating a result of energy dispersive X-ray (EDX) analysis performed for Fe element regarding the stack structure of the MTJ element.

FIG. 11 is a view (graph) illustrating a result of EDX-ray (energy dispersive X-ray) analysis performed of element Fe regarding the stack structure of the magnetic tunnel junction element of cases where PT is performed/not performed to the Pt foundation. FIG. 11(a) illustrates the characteristics of the case where PT is not performed, and FIG. 11(b) illustrates the characteristics of the case where PT is performed. With reference to the illustrated stack structure, deposition is performed from the underlayer on the right side, and EDX-ray analysis results are shown of cases where plasma treatment (PT) is performed/not performed (PT performed/not performed) to the Pt (Pt foundation) constituting the underlayer. Both figures illustrate the content characteristics of Fe contained in the stack structure of the magnetic tunnel junction element illustrated on the graph, wherein the analysis result immediately after deposition (as depo) is illustrated by a solid line and the analysis result after performing heat processing (annealing) for one hour at 400° C. is illustrated by a broken line.

As illustrated in FIG. 11(a), in a case where PT is not performed to the Pt foundation, it is clear from the graph that by performing heat processing (annealing) at 400° C., the Fe contained in CoFeB constituting the reference layer is diffused to the [Co/Pt] side of the fixed layer (changed from solid line to broken line as shown in the arrow). However, as illustrated FIG. 11(b), in the case where PT is performed to the Pt foundation, even if heat processing (annealing) is performed at 400° C., there is no significant variation in the Fe contained in CoFeB constituting the reference layer, and it can be recognized that diffusion of Fe is suppressed. In this state, the amount of Fe elements diffused in Co/Pt is 2 at %/nm or smaller. Thus, the deterioration of perpendicular magnetic anisotropy is suppressed and the TMR ratio is improved.

Further, a state of variation of grain size and variation of layer lattice spacing of cases where plasma treatment (PT) is performed/not performed to the Pt foundation are illustrated by TEM observation of the cross-section (cross-sectional observation using transmission electron microscope).

Figure 12:
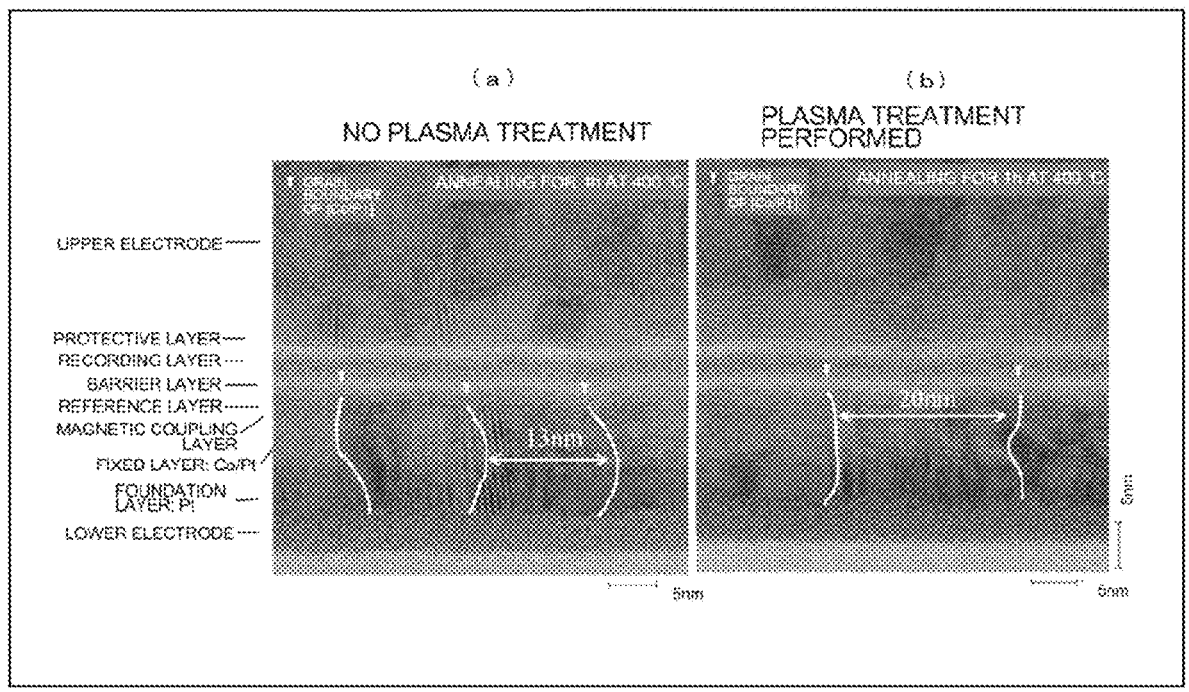
FIG. 12 is an image taken by TEM of grain boundary of [Co/Pt] at a cross-section of the fixed layer.

FIG. 12 is a view of TEM images of the cross-section of the magnetic tunnel junction element where heat processing (annealing) was performed for one hour at 400° C. FIG. 12(a) shows a sample image without PT, and FIG. 12(b) shows a sample image with PT performed. Focusing on the grain boundary of [Co/Pt] at the cross section of the fixed layer, in both images, portions indicated by marks "▼" are [Co/Pt] grain boundaries. As illustrated, in the sample where PT was not performed, the [Co/Pt] grain size is approximately 13 nm, whereas in the sample where PT was performed, grain size is assumed to be approximately 20 nm. By such increase in grain size, it is estimated that roughness was reduced and perpendicular magnetic anisotropy was increased. Further, since the crystal grain boundary is reduced when the grain size is increased, the diffusion of Fe elements through the grain boundary is suppressed.

Figure 13:
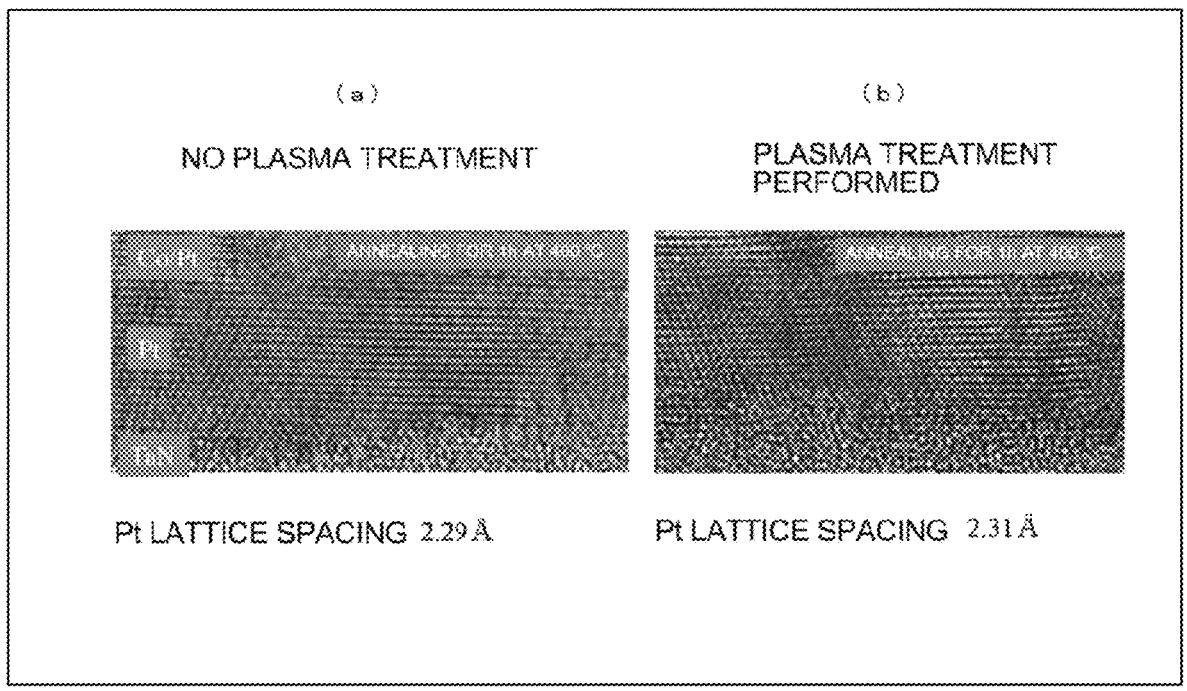
FIG. 13 is an image taken by TEM of the cross-section of [Co/Pt] of the fixed layer and a Pt foundation formed thereunder.
Figure 14:
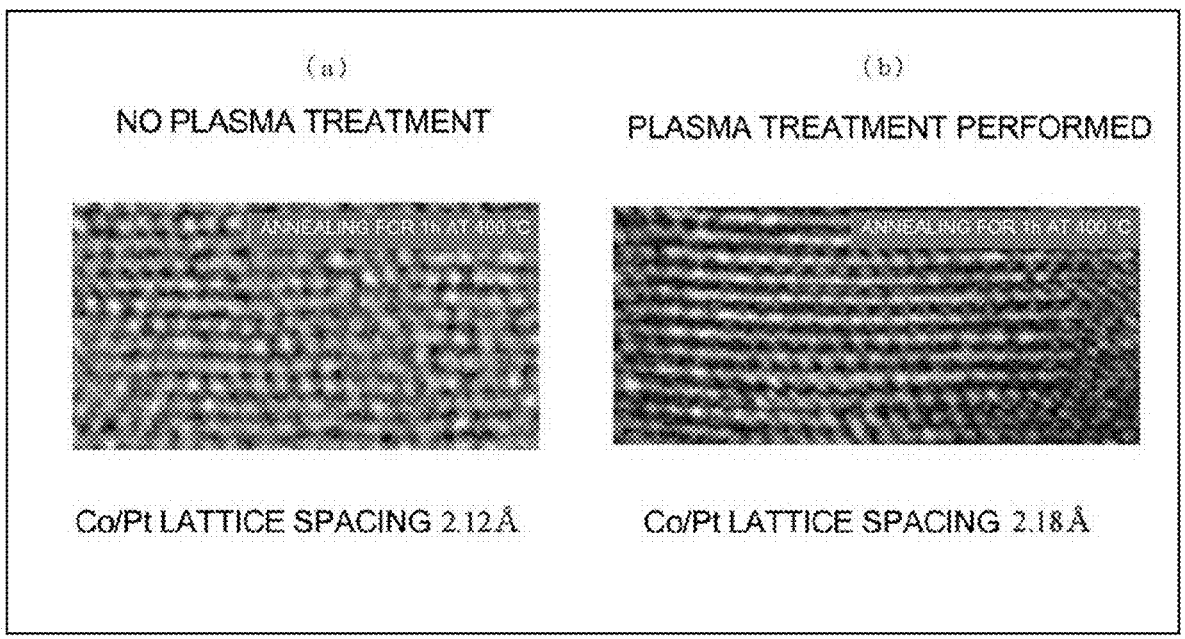
FIG. 14 is a TEM image of FIG. 11 in which the [Co/Pt] portion of the fixed layer is enlarged.

FIGS. 13 and 14 are TEM images of cross-sections from the [Co/Pt] of the fixed layer, the Pt of the underlayer formed thereunder and the TaN of the lower electrode formed thereunder of cases where heat processing (annealing) was performed similarly for one hour at 400° C. FIGS. 13(a) and 14(a) are images of samples where PT was not performed, and FIGS. 13(b) and 14(b) are images of samples where PT was performed. Especially, FIG. 14 is an image where the [Co/Pt] portion is enlarged. When PT was not performed, lattice spacing of Pt is approximately 2.29 Å and lattice spacing of [Co/Pt] is approximately 2.12 Å. Meanwhile, when PT was performed, the lattice spacing of Pt is approximately 2.31 Å and the lattice spacing of [Co/Pt] is approximately 2.18 Å.

By comparing the views, it can be recognized that the crystal alignment property and the lattice spacing are varied by performing PT and not performing PT. As for the [Co/Pt] of the fixed layer, as can be seen from FIG. 14, it can be recognized that the crystal lattice stripes of [Co/Pt] are more aligned when PT is performed. That is, it has been confirmed that the crystal alignment property of [Co/Pt] has been improved.

The evaluation result of improvement of crystal alignment property of [Co/Pt] described above, that is, the improvement of heat resistance of Pt foundation by plasma treatment (PT) using High Resolution Rutherford Backscattering Spectrometry (HR-RBS) analysis (hereinafter referred to as "HR-RBS analysis"), will be described hereafter.

Figure 15:
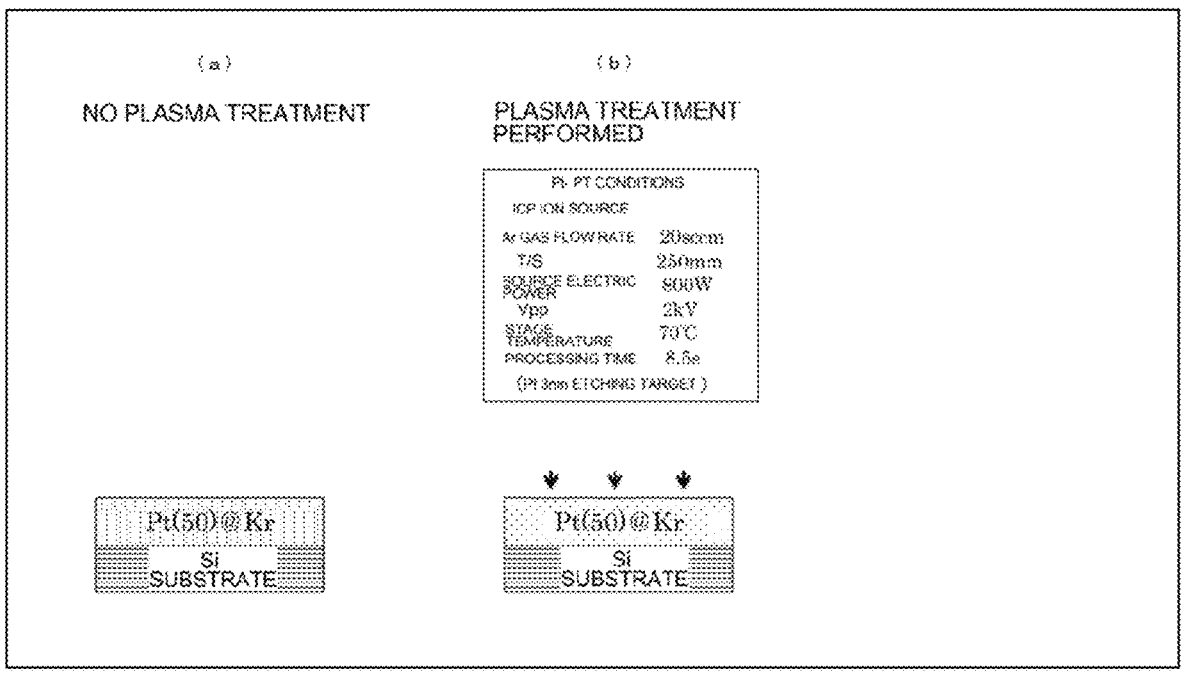
FIG. 15 is a schematic diagram of a case where plasma treatment (PT) using Ar is performed/not performed to the Pt foundation.

FIG. 15 is a schematic diagram illustrating cases where plasma treatment (PT) using Ar was performed/not performed to the Pt foundation for comparison using HR-RBS analysis. FIG. 15(a) illustrates a case where PT was not performed and FIG. 15(b) illustrates a case where PT was performed, wherein the Pt-PT conditions are as shown. Pt of 50 nm was deposited using Kr gas on a silicon (Si) substrate, and after deposition, plasma treatment (PT) was performed on the surface thereof on site. Thereafter, the sample was subjected to HR-RBS analysis, and implantation depth and implantation quantity of Ar was evaluated.

Figure 16:
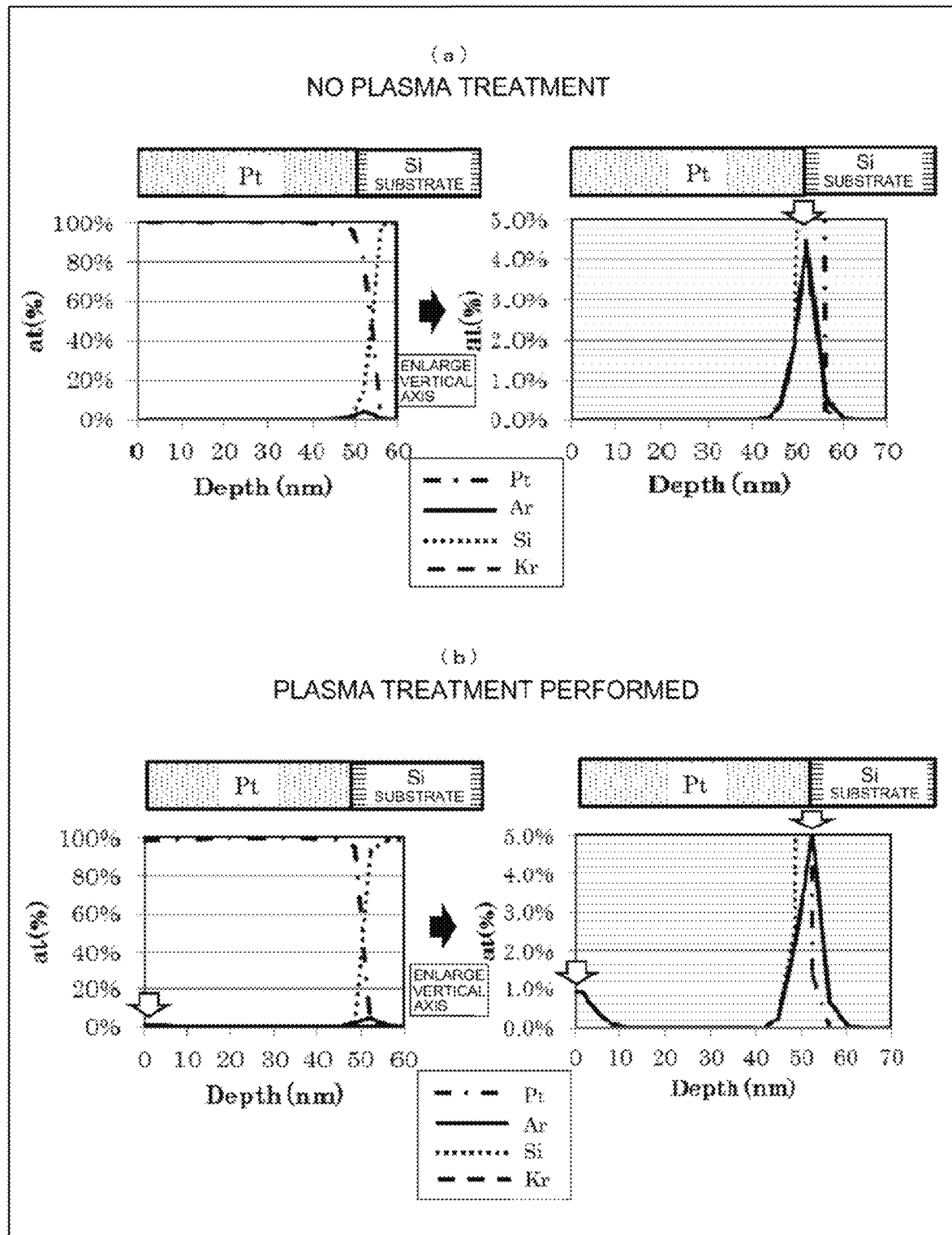
FIG. 16 is a view illustrating measurement results by HR-RBS analysis.

FIG. 16 is a view illustrating measurement results by HR-RBS analysis described above, wherein FIG. 16(a) illustrates a case where PT was not performed, and FIG. 16(b) illustrates a case where PT was performed. In both figures, the right-side drawing illustrates an enlarged view having enlarged the atomic percentage (at %) on the vertical axis (wherein the maximum value is enlarged from 100% to 5%). As illustrated in FIG. 16(b), in the sample where PT was performed, Ar was detected in the 10 nm range from the Pt surface. The Ar on the surface of the silicon (Si) substrate has been implanted during substrate cleaning prior to deposition. In the drawing, graph line type of Kr is illustrated, but since Kr was below lower limit of detection by measurement, it is not shown in the drawing.

As described, by implanting Ar in the Pt foundation, the Pt crystal lattice spacing was changed, the crystal lattice mismatch of [Co/Pt] decreased, and it could be evaluated that the crystal alignment property was improved. Thereby, the perpendicular magnetic characteristics was improved.

As described, based on the analysis results of the cross-section of the magnetic tunnel junction element according to the manufacturing method according to the present invention, the following has been recognized as the effect of performing plasma treatment (PT) to the Pt foundation. That is, by changing the crystal alignment property of Pt, the crystal grains of [Co/Pt] became greater, and thereby, the decrease in crystal grain boundary suppressed the diffusion of grain boundary of Fe, and the crystal alignment property of [Co/Pt] was improved, according to which heat resistance and perpendicular magnetic anisotropy was improved.

According further to the magnetic tunnel junction element of the present invention, magnetic films of various crystallinity can be adopted as the fixed layer in addition to the Co alloy-based perpendicular magnetic film.

For example, an FePt perpendicular magnetic film can be used. An FePt alloy is a $L_{10}$-type ordered alloy, and in order to magnetize the same in a perpendicular direction to the substrate, it is necessary to realize crystal alignment of the crystal axis (c) perpendicular to the film surface. Those having an NaCl structure, an fcc structure and a bcc structure are often used as the crystal structure of the foundation film for aligning the crystal. For example, an MgO film having an NaCl structure, a CrRu alloy film having an fcc crystal structure, a Cr/Ta having a bcc crystal structure or a Cr/MgO stacked film are often used as the foundation film.

Further, an $SmCo_5$-based perpendicular magnetic film can be used. Even in this case, in order to magnetize the film in the direction perpendicular to the substrate, it is necessary to realize crystal alignment of the crystal axis (c) in the direction perpendicular to the film surface. A structure having an fcc structure is used as the crystal structure of the foundation film for crystal alignment. For example, Cu of an fcc crystal structure or a Cu/Ti stacked film is often used.

As for the applicability of the magnetic tunnel junction element of the present invention, it is applicable not only to STT elements but also to three-terminal SOT (Spin Orbit Torque) elements.

REFERENCE SIGNS LIST 10 magnetic tunnel junction (MTJ) element
11 reference layer
12 barrier layer
13 recording layer
14 protective layer
15 base layer
25 fixed layer
26 magnetic coupling layer
27 substrate
28 lower electrode layer
29 underlayer
30 upper electrode layer
31 third ferromagnetic layer
32 fourth ferromagnetic layer
33 nonmagnetic layer

The invention claimed is:

1. A magnetic tunnel junction element comprising a stacked body stacked in a following stack order,
   an underlayer formed of a metal material,
   a fixed layer formed of a ferromagnetic body,
   a magnetic coupling layer formed of a nonmagnetic body,
   a reference layer formed of a ferromagnetic body,
   a barrier layer formed of a nonmagnetic body, and
   a recording layer formed of a ferromagnetic body,
   wherein a magnetization direction of the fixed layer, the reference layer and the recording layer is perpendicular to a film surface, and
   the underlayer contains one of argon (Ar), krypton (Kr) and xenon (Xe) on a surface that is in contact with the fixed layer.

2. The magnetic tunnel junction element according to claim 1,
   the underlayer contains enough amount of one of argon (Ar), krypton (Kr) and xenon (Xe) on a surface that is in contact with the fixed layer so that a crystal lattice spacing of the underlayer is varied.

3. The magnetic tunnel junction element according to claim 1,
   wherein the fixed layer comprises two layers formed of a ferromagnetic body and a nonmagnetic body sandwiched between the two layers.

4. The magnetic tunnel junction element according to claim 1,
   wherein the fixed layer includes a stacked film formed at least of a cobalt (Co) film and a platinum (Pt) film,
   the reference layer is formed of a ferromagnetic body containing iron (Fe),
   the underlayer contains enough argon (Ar) at an area that is in contact with the fixed layer such that a crystal lattice spacing of the underlayer is varied, and
   the stacked film forming the fixed layer has a property in that crystal lattice mismatch of the stacked film is decreased and crystal alignment property is improved.

5. The magnetic tunnel junction element according to claim 1, further comprising
   a protective layer disposed adjacent to the recording layer on a side opposite from a side having the barrier layer.

6. A method for manufacturing a magnetic tunnel junction element,
   the magnetic tunnel junction element configured by stacking, in a following stack order,
   an underlayer formed of a metal material,
   a fixed layer formed of a ferromagnetic body,
   a magnetic coupling layer formed of a nonmagnetic body,
   a reference layer formed of a ferromagnetic body,
   a barrier layer formed of a nonmagnetic body, and
   a recording layer formed of a ferromagnetic body,
   or alternatively, the magnetic tunnel junction element configured by stacking, in a following stack order,
   a recording layer formed of a ferromagnetic body,
   a barrier layer formed of a nonmagnetic body,
   a reference layer formed of a ferromagnetic body,
   a magnetic coupling layer formed of a nonmagnetic body,
   an underlayer formed of a metal material, and
   a fixed layer formed of a ferromagnetic body,
   wherein a magnetization direction of the fixed layer, the reference layer and the recording layer is perpendicular to a film surface, and
   the fixed layer is formed and stacked after removing 1 nm or more of a surface of the formed underlayer by sputter etching, and
   wherein at least one of argon (Ar), krypton (Kr) and xenon (Xe) is used for the sputter etching, and
   wherein the sputter etching causes enough amount of at least one of argon (Ar), krypton (Kr) and xenon (Xe) to be contained at an area of the underlayer in contact with the fixed layer so that a crystal lattice spacing of the underlayer is varied.

* * * * *